(12) United States Patent
Yamazaki et al.

(10) Patent No.: US 8,541,782 B2
(45) Date of Patent: Sep. 24, 2013

(54) METHOD FOR EVALUATING OXIDE SEMICONDUCTOR AND METHOD FOR MANUFACTURING SEMICONDUCTOR DEVICE

(75) Inventors: Shunpei Yamazaki, Tokyo (JP); Akiharu Miyanaga, Kanagawa (JP); Tatsuya Honda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 194 days.

(21) Appl. No.: 12/940,724

(22) Filed: Nov. 5, 2010

(65) Prior Publication Data
US 2011/0111535 A1     May 12, 2011

(30) Foreign Application Priority Data
Nov. 6, 2009   (JP) ................. 2009-255230

(51) Int. Cl.
*H01L 23/58* (2006.01)

(52) U.S. Cl.
USPC ...... 257/48; 257/E21.521; 324/519; 324/663; 324/671; 324/600; 324/658

(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

J. Siddiqui, E. Cagin, D. Chen, and J. D. Phillips , ZnO thin-film transistors with polycrystalline (Ba,Sr)TiO3 gate insulators, Appl. Phys. Lett. 88, 212903 (2006).*

(Continued)

*Primary Examiner* — Steven Loke
*Assistant Examiner* — Cuong B Nguyen
(74) *Attorney, Agent, or Firm* — Fish & Richardson P.C.

(57) ABSTRACT

Many of the principles of an oxide semiconductor are still unclear and therefore there is no established method for evaluating an oxide semiconductor. Thus, an object is to provide a novel method for evaluating an oxide semiconductor. Carrier density is evaluated, and hydrogen concentration is also evaluated. Specifically, a MOS capacitor (a diode or a triode) is manufactured, and the C-V characteristics of the MOS capacitor are obtained. Then, the carrier density is estimated from the C-V characteristics obtained.

9 Claims, 4 Drawing Sheets

(56) References Cited

U.S. PATENT DOCUMENTS

| | | |
|---|---|---|
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| WO | 2004/114391 A1 | 12/2004 |

OTHER PUBLICATIONS

Mutsumi Kimura, Takashi Nakanishi, Kenji Nomura, Toshio Kamiya, and Hideo Hosono,Trap densities in amorphous-InGaZnO4 thin-film transistors, Appl. Phys. Lett. 92, 133512 (2008).*

Badih El-Kareh, Silicon Devices and Process Integration: Deep Submicron and Nano-scale Technologies, Springer, Jan. 12, 2009, p. 213-270.*

Mitsuru Nakata, Kazushige Takechi, Toshimasa Eguchi, Eisuke Tokumitsu, Hirotaka Yamaguchi, and Setsuo Kaneko ,Effects of Thermal Annealing on ZnO Thin-Film Transistor Characteristics and the Application of Excimer Laser Annealing in Plastic-Based ZnO Thin-Film Transistors, Jpn. J. Appl. Phys. 48 (2009) 081608 (7 pages).*

F. R. Blom, F. C. M. Van De Pol, G. Bauhuis and Th. J. A. Popma, "RF planar magnetron sputtered ZnO films. II, Electrical properties." Thin solid films 204, No. 2 (1991): 365-376.*

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper:Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Apdl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas." The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m= 3, 4, and 5), InGaO3(ZnO)3, and Ga2O3(ZnO)m (m= 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al.. "UHF RFCPUS on Flexible and Glass Substrates for Secure RFID Systems,", Journal of Solid-State Circuits, 2008, vol. 43, No. 1, pp. 292-299.

Lany, S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Lee, H et al., "Current Status of, Challenges to, and Perspective View of AM-OLED ,", IDW '06 : Proceedings of the 13th International Display Workshops, Dec. 7, 2006, pp. 663-666.

Lee, J et al.. "World's Largest (15-Inch) XGA AMLCD Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of The Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

METHOD FOR EVALUATING OXIDE SEMICONDUCTOR AND METHOD FOR MANUFACTURING SEMICONDUCTOR DEVICE

BACKGROUND OF THE INVENTION

1. Field of the Invention

A technical field of the present invention relates to an evaluation method, a method for manufacturing a semiconductor device, and the like.

2. Description of the Related Art

Reference 1 discloses a method for manufacturing a semiconductor device including an oxide semiconductor.

[Reference 1] Japanese Published Patent Application No. 2007-123861

SUMMARY OF THE INVENTION

Many of the principles of a silicon semiconductor have already been understood, whereas many of the principles of an oxide semiconductor are still unclear and therefore there is no established method for evaluating an oxide semiconductor.

Thus, it is a first object to provide a novel method for evaluating an oxide semiconductor.

It is a second object to provide a method for feeding back a result of evaluation of an oxide semiconductor to a manufacturing process of a semiconductor device including an oxide semiconductor (a device including a semiconductor element such as a transistor or a diode).

It is a third object to provide a novel method for measuring the relative permittivity of an oxide semiconductor.

Note that the invention disclosed below solves at least one of the first to third objects.

In a silicon semiconductor, hydrogen is a favorable atom which compensates for dangling bonds.

On the other hand, as a result of research by the present inventors, it is found that hydrogen in an oxide semiconductor induces unwanted carriers and is therefore an unfavorable atom in the case where an oxide semiconductor is used for a channel formation region of a transistor.

Here, as the concentration of hydrogen in an oxide semiconductor decreases, the carrier density (carrier concentration) of the oxide semiconductor also decreases.

Then, if the carrier density can be evaluated, the concentration of impurities such as hydrogen can also be evaluated.

Thus, the evaluation of the carrier density makes it possible to make an evaluation as to what kind of process should be performed to decrease the hydrogen concentration.

For example, in the case of performing heat treatment, a plurality of samples are prepared under different heating conditions such as heating temperatures, heating time, or heating methods, and the carrier densities of the plurality of samples are compared with each other. Accordingly, it is possible to make an evaluation as to what is the optimum heating condition for removing hydrogen.

For example, in the case of forming an oxide semiconductor layer, a plurality of samples were prepared under different film formation conditions such as film formation temperatures, film formation atmospheres, or film formation chamber evacuating methods, and the carrier densities of the plurality of samples are compared with each other. Accordingly, it is possible to make an evaluation as to what is the optimum film formation condition for removing hydrogen.

Specifically, a MOS capacitor is manufactured, and the results of C-V measurement (C-V characteristics) of the MOS capacitor are evaluated. Accordingly, the carrier density can be measured.

In other words, an evaluation method includes the step of forming a MOS capacitor including an oxide semiconductor layer, the step of obtaining a C-V characteristic by plotting a relationship between a gate voltage $V_g$ and a capacitance C of the MOS capacitor, the step of obtaining a graph by plotting a relationship between the gate voltage $V_g$ and $(1/C)^2$ with the use of the C-V characteristic, and the step of calculating a carrier density $N_d$ by obtaining a differential value of $(1/C)^2$ in a weak inversion region of the graph and substituting the differential value into the following mathematical formula (12). Note that in the mathematical formula (12), e is the electron charge, $\epsilon_0$ is the vacuum permittivity, and $\epsilon$ is the relative permittivity of the oxide semiconductor layer.

$$N_d = -\left(\frac{2}{e\epsilon_0\epsilon}\right) \bigg/ \frac{d(1/C)^2}{dV} \quad (12)$$

In addition, an evaluation method includes the step of forming a first MOS capacitor by forming a first oxide semiconductor layer over a silicon wafer and forming a gate electrode over the first oxide semiconductor layer, the step of obtaining a first C-V characteristic of the first MOS capacitor, the step of obtaining a capacitance $C_a$ in an accumulation region of the first C-V characteristic, the step of obtaining a relative permittivity $\epsilon$ of the first oxide semiconductor layer by substituting the capacitance $C_a$ into the following mathematical formula (14), the step of forming a second MOS transistor by forming a second oxide semiconductor layer under a film formation condition which is identical to that of the first oxide semiconductor layer, the step of obtaining a second C-V characteristic by plotting a relationship between a gate voltage $V_g$ and a capacitance C of the second MOS capacitor, the step of obtaining a graph by plotting a relationship between the gate voltage $V_g$ and $(1/C)^2$ with the use of the second C-V characteristic, and the step of calculating a carrier density $N_d$ by obtaining a differential value of $(1/C)^2$ in a weak inversion region in the graph and substituting the differential value and a relative permittivity $\epsilon$ of the first oxide semiconductor layer into the following mathematical formula (12). Note that in the mathematical formula (12), e is the electron charge and $\epsilon_0$ is the vacuum permittivity, and in the mathematical formula (14), S is the area of the gate electrode and d is the thickness of the first oxide semiconductor layer.

$$\epsilon = C_a \frac{1}{\epsilon_0} \frac{d}{S} \quad (14)$$

$$N_d = -\left(\frac{2}{e\epsilon_0\epsilon}\right) \bigg/ \frac{d(1/C)^2}{dV} \quad (12)$$

In addition, in an evaluation method, a MOS capacitor including an oxide semiconductor layer is formed, a C-V characteristic of the MOS capacitor is obtained, and a carrier density of the oxide semiconductor layer is determined with reference to a capacitance of the MOS capacitor when a gate voltage of the MOS capacitor is 0.

In addition, a method for manufacturing a semiconductor device includes the step of forming a MOS capacitor including an oxide semiconductor layer and a transistor including an oxide semiconductor layer at a time, the step of obtaining a C-V characteristic by plotting a relationship between a gate voltage $V_g$ and a capacitance C of the MOS capacitor, the step of obtaining a graph by plotting a relationship between the gate voltage $V_g$ and $(1/C)^2$ with the use of the C-V characteristic, the step of calculating a carrier density $N_d$ by obtaining a differential value of $(1/C)^2$ in a weak inversion region in the graph and substituting the differential value into the following mathematical formula (12), and the step of performing heat treatment of the transistor when the carrier density is determined to be high. Note that in the mathematical formula (12), e is the electron charge, $\epsilon_0$ is the vacuum permittivity, and $\epsilon$ is the relative permittivity of the oxide semiconductor layer.

$$N_d = -\left(\frac{2}{e\varepsilon_0\varepsilon}\right) \bigg/ \frac{d(1/C)^2}{dV} \quad (12)$$

In addition, a method for manufacturing a semiconductor device includes the step of forming a first MOS capacitor by forming a first oxide semiconductor layer over a silicon wafer and forming a gate electrode over the first oxide semiconductor layer, the step of obtaining a first C-V characteristic of the first MOS capacitor, the step of obtaining a capacitance $C_a$ in an accumulation region of the first C-V characteristic, the step of obtaining a relative permittivity $\epsilon$ of the first oxide semiconductor layer by substituting the capacitance $C_a$ into the following mathematical formula (14), the step of forming a second MOS capacitor and a transistor including a second oxide semiconductor layer formed under a film formation condition which is identical to that of the first oxide semiconductor layer, the step of obtaining a second C-V characteristic by plotting a relationship between a gate voltage $V_g$ and a capacitance C of the second MOS capacitor, the step of obtaining a graph by plotting a relationship between the gate voltage $V_g$ and $(1/C)^2$ with the use of the second C-V characteristic, the step of calculating a carrier density $N_d$ by obtaining a differential value of $(1/C)^2$ in a weak inversion region in the graph and substituting the differential value and the relative permittivity $\epsilon$ of the first oxide semiconductor layer into the following mathematical formula (12), and the step of performing heat treatment of the transistor when the carrier density is determined to be high. Note that in the mathematical formula (12), e is the electron charge and $\epsilon_0$ is the vacuum permittivity, and in the mathematical formula (14), S is the area of the gate electrode and d is the thickness of the first oxide semiconductor layer.

$$\varepsilon = C_a \frac{1}{\varepsilon_0} \frac{d}{S} \quad (14)$$

$$N_d = -\left(\frac{2}{e\varepsilon_0\varepsilon}\right) \bigg/ \frac{d(1/C)^2}{dV} \quad (12)$$

As described above, a novel method for evaluating an oxide semiconductor can be provided.

In addition, by evaluating an oxide semiconductor and giving feedback, a high-performance semiconductor device can be provided.

Furthermore, a semiconductor element is manufactured and then evaluated, and when it is determined that hydrogen is not sufficiently removed, heat treatment is additionally performed. Accordingly, a so-called repair step can be performed. Note that repairing a semiconductor layer itself is a quite novel idea.

DETAILED DESCRIPTION OF THE INVENTION

Figure 1A:
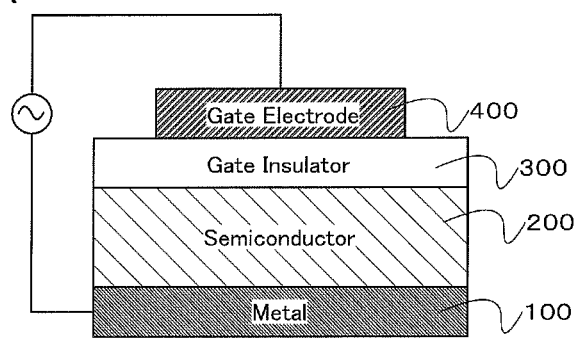
FIGS. 1A and 1B each illustrate an example of a MOS capacitor.

Embodiments will be described in detail with reference to the drawings.

Note that it is easily understood by those skilled in the art that the modes and details of the present invention can be modified in various ways without departing from the spirit and scope thereof.

Therefore, the scope of the present invention should not be interpreted as being limited to the description in the following embodiments.

Note that in structures described below, the same portions or portions having similar functions are denoted by the same reference numerals in different drawings, and explanation thereof will not be repeated.

The following embodiments can be implemented in combination as appropriate.

(Embodiment 1)

Figure 1B:
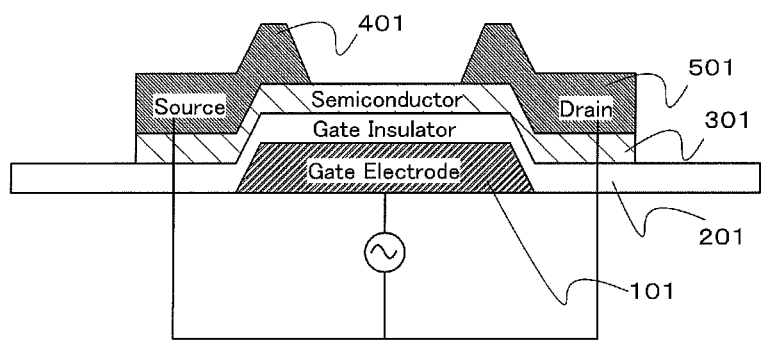

FIGS. 1A and 1B each illustrate an example of a MOS capacitor.

FIG. 1A is a diode and FIG. 1B is a triode.

In FIG. 1A, a semiconductor layer 200 (Semiconductor) is provided over a metal layer 100 (Metal), and a gate insulating layer 300 (Gate Insulator) is provided over the semiconductor layer 200 (Semiconductor), and a gate electrode layer 400 (Gate Electrode) is provided over the gate insulating layer 300 (Gate Insulator).

In addition, in FIG. 1A, the metal layer 100 (Metal) and the gate electrode layer 400 (Gate Electrode) are connected to each other through a power source.

In FIG. 1B, a gate insulating layer 201 (Gate Insulator) is provided over a gate electrode layer 101 (Gate Electrode), and a semiconductor layer 301 (Semiconductor) is provided over the gate insulating layer 201 (Gate Insulator), and a source electrode layer 401 (Source) and a drain electrode layer 501 (Drain) are provided over the semiconductor layer 301 (Semiconductor).

In addition, in FIG. 1B, the source electrode layer 401 (Source) and the drain electrode layer 501 (Drain) are connected to the gate electrode layer 101 (Gate Electrode) through a power source.

The diode of FIG. 1A has an advantage in that it can be easily manufactured without a photolithography step.

Thus, the diode is suitable for an experiment for examining the effectiveness of a specific step (for example, comparison of heating conditions, comparison of film formation conditions, and the like).

On the other hand, the triode of FIG. 1B has a structure obtained by electrically connecting a source and a drain of a transistor.

Thus, it is easy to form the triode at the same time as a transistor, and the triode is therefore suitable for evaluation in the case of forming a transistor.

Note that the semiconductor layer (Semiconductor) can be formed using, for example, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—

Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, a Zn—O-based oxide semiconductor, or the like.

This embodiment can be implemented in combination with any of the other embodiments.

(Embodiment 2)

The evaluation of results of C-V measurement (C-V characteristics) of a MOS capacitor will be described.

Figure 2A:
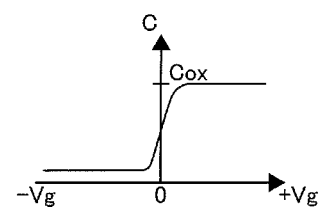
FIGS. 2A and 2B each show an example of C-V characteristics.
Figure 2B:
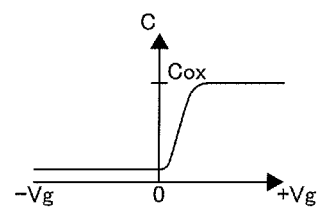

FIGS. 2A and 2B each show an example of results of C-V measurement (C-V characteristics) of an oxide semiconductor.

Here, FIG. 2A shows an example of results of C-V measurement (C-V characteristics) in the case where hydrogen is contained in an oxide semiconductor.

On the other hand, FIG. 2B shows an example of results of C-V measurement (C-V characteristics) in the case where hydrogen is not contained in an oxide semiconductor.

In an oxide semiconductor, hydrogen serves as a donor.

Therefore, an oxide semiconductor which contains hydrogen is an n-type semiconductor (FIG. 2A).

On the other hand, an oxide semiconductor which does not contain hydrogen is close to an i-type (intrinsic) semiconductor (FIG. 2B).

Thus, when hydrogen is contained in an oxide semiconductor, the graph of C-V characteristics is shifted to the left side (compare FIG. 2A to FIG. 2B).

In other words, it can be determined that the carrier density is increased if a capacitance C at $V_g$ (gate voltage) of 0 is larger than that at $V_g$ which is negative (in a strong inversion region).

In other words, it can be determined that the hydrogen concentration is increased if the capacitance C at $V_g$ (gate voltage) of 0 is larger than that at $V_g$ which is negative (in a strong inversion region).

This embodiment can be implemented in combination with any of the other embodiments.

(Embodiment 3)

In the case where only a small amount of hydrogen is contained, it may be difficult to make an evaluation according to the method described in Embodiment 2.

Thus, in this embodiment, an evaluation method which is different from that in Embodiment 2 will be described.

Specifically, a method for estimating the carrier density of an oxide semiconductor from a C-V curve will be described.

First, the mathematical formula (1) can be provided, where C is the capacitance per unit area of an oxide semiconductor which is measured by C-V measurement, $C_d$ is the depletion layer capacitance per unit area of the oxide semiconductor, and $C_{ox}$ is the capacitance of the gate insulating film.

$$\frac{1}{C} = \frac{1}{C_d} + \frac{1}{C_{ox}} \tag{1}$$

By transposing the mathematical formula (1), the mathematical formula (2) can be obtained.

$$\frac{1}{C_d} = \frac{1}{C} - \frac{1}{C_{ox}} \tag{2}$$

Here, in the case of considering a weak inversion state, it is assumed that induced minority carriers are negligible.

Then, the charge Q per unit area which is generated in a depletion layer can be expressed by the mathematical formula (3), where $N_d$ is the carrier density, $W_d$ is the depletion layer width, and e is the electron charge.

$$Q = eN_d W_d \tag{3}$$

Then, the capacitance C can be given by the mathematical formula (4), where V is the voltage applied to the gate electrode.

$$C = \frac{dQ}{dV} \tag{4}$$

On the other hand, the depletion layer capacitance $C_d$ can be expressed by the mathematical formula (5) with the charge Q and the surface potential $\psi$. Note that $\epsilon_0$ is the vacuum permittivity and $\epsilon$ is the relative permittivity of a semiconductor.

$$C_d = \frac{dQ}{d\psi} = \frac{\epsilon_0 \epsilon}{W_d} \tag{5}$$

In addition, the surface potential $\psi$ at a semiconductor interface can be given by the mathematical formula (6) by solving the Poisson equation.

$$\psi = -\frac{eN_d W_d^2}{2\epsilon_0 \epsilon} \tag{6}$$

By substituting the mathematical formula (6) into the mathematical formula (5), the mathematical formula (7) can be derived.

$$\psi = -\frac{e\epsilon_0 \epsilon N_d}{2}\left(\frac{1}{C_d}\right)^2 \tag{7}$$

From the mathematical formulae (3) to (7), the mathematical formula (8) can be derived.

$$C_d = \frac{dQ}{d\psi} = \frac{dQ}{dV}\left(\frac{d\psi}{dV}\right)^{-1} = -C\left(\frac{2}{eN_d\epsilon_0\epsilon}\right)\Big/\left(\frac{d(1/C_d)^2}{dV}\right) \tag{8}$$

By taking reciprocals of both sides of the mathematical formula (8), the mathematical formula (9) can be given.

$$\frac{1}{C_d} = -\frac{1}{C}\frac{eN_d\epsilon_0\epsilon}{2}\frac{d(1/C_d)^2}{dV} \tag{9}$$

By substituting the mathematical formula (2) into the mathematical formula (9), the mathematical formula (10) can be obtained.

$$\frac{1}{C} - \frac{1}{C_{ox}} = -\frac{1}{C}\frac{eN_d\epsilon_0\epsilon}{2}\frac{d((1/C) - (1/C_{ox}))^2}{dV} \tag{10}$$

$N_d$ can be calculated from the mathematical formula (10) as expressed by the mathematical formula (11).

$$N_d = -\frac{2C}{e\varepsilon_0\varepsilon}\left(\frac{1}{C} - \frac{1}{C_{ox}}\right) \bigg/ \frac{d((1/C) - (1/C_{ox}))^2}{dV} \quad (11)$$

Here, in a weak inversion state, it can be assumed that $C \ll C_{ox}$. Thus, $1/C_{ox}$ can be assumed to be 0, and therefore the mathematical formula (11) can be approximated.

Then, by approximating the mathematical formula (11), the mathematical formula (12) can be obtained.

$$N_d = -\left(\frac{2}{e\varepsilon_0\varepsilon}\right) \bigg/ \frac{d(1/C)^2}{dV} \quad (12)$$

Figure 3A:
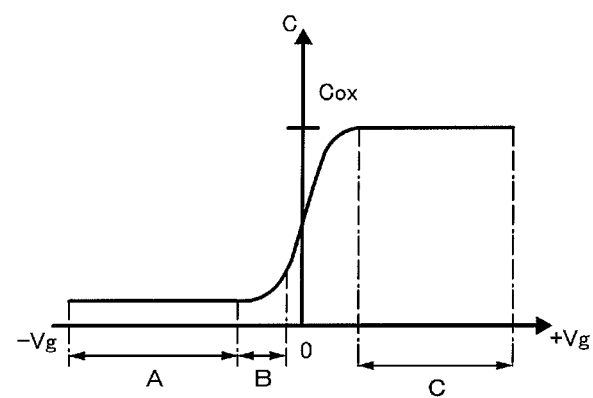
FIGS. 3A and 3B show an example of C-V characteristics.
Figure 3B:
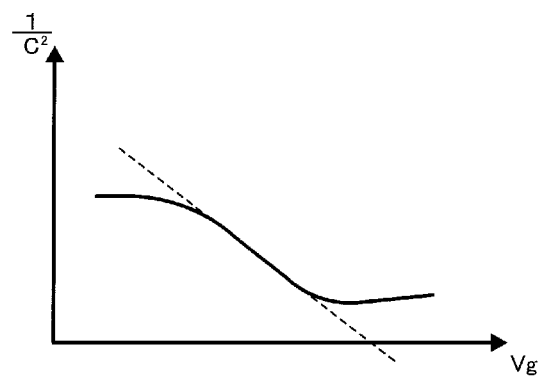

See FIGS. 3A and 3B.

FIG. 3A is a graph in which the relationship between gate voltage $V_g$ and capacitance C is plotted, and FIG. 3B is a graph in which the relationship between gate voltage $V_g$ and $(1/C)^2$ is plotted.

In FIG. 3A, "A" corresponds to a strong inversion region; "B", a weak inversion region adjacent to the strong inversion region; and "C", an accumulation region.

Note that in order to calculate a differential value of $(1/C)^2$ in the mathematical formula (12), the weak inversion region is used, which is adjacent to the strong inversion region where it can be particularly assumed that $C \ll C_{ox}$.

Note that as the weak inversion region adjacent to the strong inversion region, a region where it can be assumed that $C \ll C_{ox}$ may be selected as appropriate.

Here, the slope of a straight line of a linear function which is indicated by a dotted line in FIG. 3B corresponds to the differential value of $(1/C)^2$ in the mathematical formula (12).

Therefore, the graph in which the relationship between gate voltage $V_g$ and $(1/C)^2$ in the weak inversion region is plotted is obtained from results of C-V measurement (C-V characteristics), and the differential value of $(1/C)^2$ in the mathematical formula (12) is obtained from the graph as obtained above.

On the other hand, the carrier density $N_d$ can be calculated by substituting the electron charge e, the vacuum permittivity $\varepsilon_0$, the relative permittivity $\varepsilon$ of a semiconductor, and the differential value of $(1/C)^2$ into the mathematical formula (12).

Note that the electron charge e ($1.60217653 \times 10^{-19}$ coulomb) and the vacuum permittivity $\varepsilon_0$ ($8.85418782 \times 10^{-12}$ $m^{-3}kg^{-1}s^4A^2$) are constants; thus, these values may be used.

The relative permittivity $\varepsilon$ of a semiconductor may be measured in advance by optical absorption spectrum measurement, electron energy loss spectroscopy, or the like.

An object of this embodiment is not to calculate an accurate carrier density but to evaluate whether hydrogen has been removed or not. Thus, the calculation may be performed using a region where $C_{ox}$ is two or more times as large as C, as the region where it can be assumed that $C \ll C_{ox}$.

Note that it is more preferable that $C_{ox}$ be five or more times, ten or more times, or a hundred or more times as large as C; however, there are cases where $C_{ox}$ is less than five times, ten times, or a hundred times as large as a minimum of C. Thus, in this embodiment, the region where it can be assumed that $C \ll C_{ox}$ is a region where $C_{ox}$ is two or more times as large as C.

This embodiment can be implemented in combination with any of the other embodiments.

(Embodiment 4)

The relative permittivity $\varepsilon$ of an oxide semiconductor layer can also be obtained from C-V characteristics.

Figure 4:
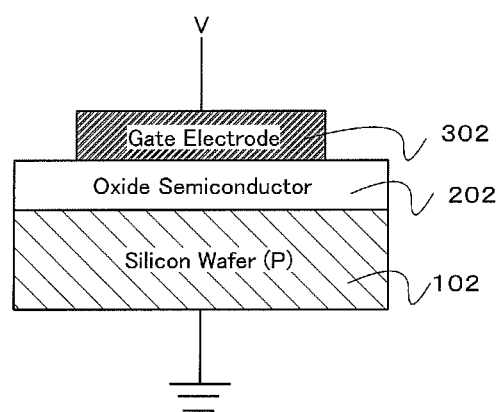
FIG. 4 illustrates an example of a MOS capacitor.

First, a diode as illustrated in FIG. 4 is formed.

In FIG. 4, an oxide semiconductor layer 202 (Oxide Semiconductor) is provided over a p-type silicon wafer 102 (Silicon Wafer (P)), and a gate electrode layer 302 (Gate Electrode) is provided over the oxide semiconductor layer 202 (Oxide Semiconductor). Note that an n-type silicon wafer may be used.

The band gap of an oxide semiconductor layer is much wider than that of silicon.

Therefore, there is a potential barrier between the conduction band of the oxide semiconductor and the conduction band of silicon. Similarly, there is a potential barrier between the valence band of the oxide semiconductor and the valence band of silicon.

Due to the presence of these potential barriers, C-V characteristics can be obtained with the structure of FIG. 4.

Note that as the resistance of the oxide semiconductor layer increases, the leakage current decreases and the measurement accuracy thus increases.

Therefore, an oxide semiconductor layer having lower carrier density can be measured with higher accuracy.

Note that the methods described in Embodiments 1 to 3 are also suitable for evaluating the carrier density of an oxide semiconductor layer having low carrier density.

Here, in an inversion state (inversion region, where $V_g$ is positive), the capacitance is the sum of the depletion layer capacitance of the p-type silicon wafer and the capacitance of the oxide semiconductor layer.

On the other hand, in an accumulation state (accumulation region, where $V_g$ is negative), an inversion layer is not formed; thus, the capacitance is equal to the capacitance of the oxide semiconductor layer and is saturated.

Then, the saturation capacitance $C_a$ in an accumulation state satisfies the relationship in the mathematical formula (13), where $\varepsilon_0$ is the vacuum permittivity, d is the thickness of the oxide semiconductor layer, and S is the area of the gate electrode.

$$C_a = \varepsilon_0 \varepsilon \frac{S}{d} \quad (13)$$

By modifying the mathematical formula (13), the mathematical formula (14) can be obtained.

$$\varepsilon = C_a \frac{1}{\varepsilon_0} \frac{d}{S} \quad (14)$$

The thickness d of the oxide semiconductor layer and the area S of the gate electrode are set at the time of manufacturing.

Note that the vacuum permittivity $\varepsilon_0$ ($8.85418782 \times 10^{-12}$ $m^{-3}kg^{-1}s^4A^2$) is a constant; thus, this value may be used.

By manufacturing a MOS capacitor having a special structure as illustrated in FIG. 4 in the above manner, the relative permittivity can be calculated using the mathematical formula (14).

This embodiment can be implemented in combination with any of the other embodiments. Note that the MOS capacitor of this embodiment and MOS capacitors of other embodiments are formed separately. Thus, the oxide semiconductor layer of the MOS capacitor of this embodiment and oxide semiconductor layers of MOS capacitors of other embodiments are preferably formed under identical film formation conditions (the same film formation conditions).

(Embodiment 5)

An example of a method for utilizing evaluation results will be described.

A plurality of samples having the structure of FIG. 1A or 1B is prepared.

In Example 1, the plurality of samples is a sample where the semiconductor layer is not heated, a sample where the semiconductor layer is heated at A° C., and a sample where the semiconductor layer is heated at B° C.

In Example 2, the plurality of samples is a sample where the semiconductor layer is not heated, a sample where the semiconductor layer is heated at A° C. in an oxygen atmosphere, and a sample where the semiconductor layer is heated at A° C. in a nitrogen atmosphere.

In Example 3, the plurality of samples is a sample where the semiconductor layer is formed at a first composition ratio, a sample where the semiconductor layer is formed at a second composition ratio, and a sample where the semiconductor layer is formed at a third composition ratio.

In Example 4, the plurality of samples is a sample where the semiconductor layer is formed at the first composition ratio by a sputtering method using only oxygen plasma, a sample where the semiconductor layer is formed at the first composition ratio by a sputtering method using only argon plasma, and a sample where the semiconductor layer is formed at the first composition ratio by a sputtering method using oxygen plasma and argon plasma.

Then, the carrier densities of the plurality of samples are compared by any of the evaluation methods in the other embodiments.

As a result of comparison of the carrier densities of the plurality of samples, the semiconductor layer formed under the conditions where the lowest carrier density is obtained can be determined to be the closest to an i-type (intrinsic) semiconductor layer.

In Example 1, it is possible to evaluate whether heating should be performed or not, whether the heating temperature is appropriate or not, and the like.

In Example 2, it is possible to evaluate whether heating should be performed or not, whether the heating atmosphere is appropriate or not, and the like.

In Example 3, it is possible to evaluate the tendency toward the optimum composition ratio.

In Example 4, it is possible to evaluate whether film formation atmosphere is appropriate or not.

By examining C-V characteristics with various different conditions as in Examples 1 to 4, the optimum process can be selected.

This embodiment can be implemented in combination with any of the other embodiments.

)Embodiment 6)

An example of a method for utilizing evaluation results will be described.

A triode having the structure of FIG. 1B and a bottom-gate TFT are formed over the same substrate.

Then, C-V characteristics of the triode are obtained by any of the evaluation methods in the other embodiments, and thus the carrier density is obtained.

When the carrier density is high, there is a possibility that heat treatment is not sufficient and hydrogen remains.

Thus, in the case where the carrier density is high, heat treatment is preferably performed again (at a temperature higher than or equal to 150° C. and lower than or equal to the upper temperature limit of the substrate, preferably at a temperature higher than or equal to 550° C. and lower than or equal to the upper temperature limit of the substrate).

Note that in the case where the carrier density is low, the process proceeds to the next step without heat treatment (in other words, no action is taken).

In addition, it is found from the experience of the present inventors that the off-state current of a transistor increases when the carrier density is $1\times10^{18}$ cm$^{-3}$ or more. Therefore, the carrier density is preferably less than $1\times10^{18}$ cm$^{-3}$.

In other words, the carrier density is determined to be high when higher than or equal to $1\times10^{18}$ cm$^{-3}$.

However, the allowable range of characteristics required for a transistor changes depending on a device for which the transistor is used. Thus, a criterion for determining whether the carrier concentration is high or low may be set as appropriate. For example, the carrier concentration may be determined to be high when higher than or equal to $1\times10^{17}$ cm$^{-3}$, $1\times10^{16}$ cm$^{-3}$, $1\times10^{15}$ cm$^{-3}$, $1\times10^{14}$ cm$^{-3}$, or the like.

In this manner, in-process inspection and repair can be performed by using any of the evaluation methods in the other embodiments.

This embodiment can be implemented in combination with any of the other embodiments.

This application is based on Japanese Patent Application serial no. 2009-255230 filed with Japan Patent Office on Nov. 6, 2009, the entire contents of which are hereby incorporated by reference.

What is claimed is:

1. A method for manufacturing a semiconductor device, comprising steps of:
    forming a MOS capacitor having a transistor including an oxide semiconductor layer over a substrate;
    obtaining a C-V characteristic by plotting a relationship between a gate voltage $V_g$ and a capacitance C of the MOS capacitor;
    obtaining a graph by plotting a relationship between the gate voltage $V_g$ and $(1/C)^2$ with the use of the C-V characteristic;
    calculating a carrier density $N_d$ by obtaining a differential value of $(1/C)^2$ in a weak inversion region in the graph and substituting the differential value into a mathematical formula:

$$N_d = -\left(\frac{2}{e\varepsilon_0\varepsilon}\right) \Big/ \frac{d(1/C)^2}{dV}$$

where e is an electron charge $\varepsilon_0$ is a vacuum permittivity, and $\varepsilon$ is a relative permittivity of the oxide semiconductor layer; and
    performing heat treatment of the transistor when the carrier density is determined to be $1\times10^{18}$ cm$^{-3}$ or more.

2. The method according to claim 1, wherein the MOS capacitor is formed by the steps of:
    forming a gate insulating layer over a gate electrode;
    forming the oxide semiconductor layer over the gate insulating layer; and
    forming a source electrode and a drain electrode over the oxide semiconductor layer, wherein the source electrode is electrically connected to the drain electrode.

3. The method according to claim 1, wherein the heat treatment is performed at a temperature higher than or equal to 150° C.

4. A method for manufacturing a semiconductor device, comprising steps of:
- forming a MOS capacitor having a transistor including an oxide semiconductor layer over a substrate;
- obtaining a C-V characteristic by plotting a relationship between a gate voltage $V_g$ and a capacitance C of the MOS capacitor;
- obtaining a graph by plotting a relationship between the gate voltage $V_g$ and $(1/C)^2$ with the use of the C-V characteristic;
- calculating a carrier density $N_d$ by obtaining a differential value of $(1/C)^2$ in a weak inversion region in the graph and substituting the differential value into a mathematical formula:

$$N_d = -\left(\frac{2}{e\varepsilon_0\varepsilon}\right) \bigg/ \frac{d(1/C)^2}{dV}$$

where e is an electron charge, $\epsilon_0$ is a vacuum permittivity, and $\epsilon$ is a relative permittivity of the oxide semiconductor layer; and
performing heat treatment of the transistor when the carrier density is determined to be $1 \times 10^{16}$ cm$^{-3}$ or more.

5. The method according to claim 4, wherein the MOS capacitor is formed by the steps of:
- forming a gate insulating layer over a gate electrode;
- forming the oxide semiconductor layer over the gate insulating layer; and
- forming a source electrode and a drain electrode over the oxide semiconductor layer, wherein the source electrode is electrically connected to the drain electrode.

6. The method according to claim 4, wherein the heat treatment is performed at a temperature higher than or equal to 150° C.

7. A method for manufacturing a semiconductor device, comprising steps of:
- forming a MOS capacitor having a transistor including an oxide semiconductor layer over a substrate;
- obtaining a C-V characteristic by plotting a relationship between a gate voltage $V_g$ and a capacitance C of the MOS capacitor;
- obtaining a graph by plotting a relationship between the gate voltage $V_g$ and $(1/C)^2$ with the use of the C-V characteristic;
- calculating a carrier density $N_d$ by obtaining a differential value of $(1/C)^2$ in a weak inversion region in the graph and substituting the differential value into a mathematical formula:

$$N_d = -\left(\frac{2}{e\varepsilon_0\varepsilon}\right) \bigg/ \frac{d(1/C)^2}{dV}$$

where e is an electron charge, $\epsilon_0$ is a vacuum permittivity, and $\epsilon$ is a relative permittivity of the oxide semiconductor layer; and
performing heat treatment of the transistor when the carrier density is determined to be $1 \times 10^{14}$ cm$^{-3}$ or more.

8. The method according to claim 7, wherein the MOS capacitor is formed by the steps of:
- forming a gate insulating layer over a gate electrode;
- forming the oxide semiconductor layer over the gate insulating layer; and
- forming a source electrode and a drain electrode over the oxide semiconductor layer, wherein the source electrode is electrically connected to the drain electrode.

9. The method according to claim 7, wherein the heat treatment is performed at a temperature higher than or equal to 150° C.

* * * * *

UNITED STATES PATENT AND TRADEMARK OFFICE
CERTIFICATE OF CORRECTION

| | | |
|---|---|---|
| PATENT NO. | : 8,541,782 B2 | |
| APPLICATION NO. | : 12/940724 | |
| DATED | : September 24, 2013 | |
| INVENTOR(S) | : Shunpei Yamazaki, Akiharu Miyanaga and Tatsuya Honda | |

It is certified that error appears in the above-identified patent and that said Letters Patent is hereby corrected as shown below:

In the Claims

Column 10, line 52, in claim 1 after "charge" insert --,--.

Signed and Sealed this
Eleventh Day of March, 2014

Michelle K. Lee
*Deputy Director of the United States Patent and Trademark Office*